(12) United States Patent
Trucco

(10) Patent No.: US 6,548,790 B1
(45) Date of Patent: *Apr. 15, 2003

(54) APPARATUS FOR MANUFACTURING SOLID SOLDER DEPOSIT PCBS

(76) Inventor: Horacio Andrés Trucco, 25 Nursery Rd., Melville, NY (US) 11747-1048

( * ) Notice: Subject to any disclaimer, the term of this patent is extended or adjusted under 35 U.S.C. 154(b) by 30 days.

This patent is subject to a terminal disclaimer.

(21) Appl. No.: 09/699,739

(22) Filed: Oct. 30, 2000

Related U.S. Application Data

(60) Provisional application No. 60/184,580, filed on Feb. 24, 2000.

(51) Int. Cl.[7] ................................................. H05B 6/10
(52) U.S. Cl. ........................ 219/605; 219/616; 219/603; 228/180.1
(58) Field of Search ................................. 219/603, 605, 219/616, 617, 650, 647, 660, 663, 665; 228/180.1; 29/860, 878

(56) References Cited

U.S. PATENT DOCUMENTS

| | | | | |
|---|---|---|---|---|
| 2,803,731 A | * | 8/1957 | Coburn | 219/616 |
| 4,983,804 A | * | 1/1991 | Chan et al. | 219/605 |
| 5,262,594 A | * | 11/1993 | Edwin et al. | 174/254 |
| 5,523,617 A | * | 6/1996 | Asanasavest | 219/603 |
| 5,984,166 A | * | 11/1999 | Holzmann | 228/254 |
| 6,229,124 B1 | * | 5/2001 | Trucco | 219/605 |

FOREIGN PATENT DOCUMENTS

| | | | | |
|---|---|---|---|---|
| EP | 0 449 790 | * | 10/1991 | |
| JP | 1-84589 | * | 3/1989 | 219/675 |
| JP | 8-291668 | * | 11/1996 | |
| JP | 9-283916 | * | 10/1997 | |

* cited by examiner

*Primary Examiner*—Philip H. Leung

(57) ABSTRACT

A novel apparatus for manufacturing Solid-Solder-Deposit Printed Circuit Boards (SSD-PCBs) by melting solder powder via induction heating consequently forming relatively thick layers of solid solder over the soldering pads of a bare-PCB 230. Solid Solder Deposit (SSD) refers to a relatively thick layer of solid solder metallurgically bonded over the soldering pads of a bare-PCB 230 such as that said SSD-PCB by itself is the source for solder alloy during a subsequent soldering operation. The manufacture of SSD-PCBs provides the electronic assembly industry with ready-to-solder PCBs consequently eliminates the need to use solder paste at the assembly floor. This invention, unlike the prior art for producing SSD-PCBs, utilizes a solder powder pile 232 that is melted by localized electromagnetic induction heating. Specifically my invention reduces the manufacturing cost, shorten manufacturing time, reduce manufacturing energy consumption and improves SSD-PCBs' quality and reliability while requiring less manufacturing equipment than prior art.

4 Claims, 2 Drawing Sheets

APPARATUS FOR MANUFACTURING SOLID SOLDER DEPOSIT PCBS

This application claims the benefits of U.S. Provisional Patent Application No. 60/184,580, filed Feb. 24, 2000. This invention uses the apparatus of my U.S. Pat. No. 6,188,052 B1 entitled Matrix-Inductor Soldering Apparatus and Device issued Feb. 13, 2001.

FIELD OF INVENTION

This invention relates to a novel apparatus for manufacturing solid-solder-deposit printed circuit boards by melting solder powder via induction heating consequently forming relatively thick layers of solid solder over the soldering pads of bare printed circuit boards.

BACKGROUND-DESCRIPTION OF THE PRIOR ART

The manufacturing of most modern electronic products requires a printed circuit board (PCB) that allows to electrically interconnect a variety of electronic components and also holds them together in a relatively rigid condition.

Manufacturing electronic products around PCBs requires a few sequential steps performed by different machines at the assembly floor. For example, such steps may comprise: (1) printing the PCB with soldering paste (an operation generally performed by stencil printing equipment), (2) placing surface-mount electronic components on that PCB face (an operation generally performed by an automated computer-controlled "pick-and-place" machine or by any other type of component placement equipment), (3) soldering the assembly (an operation generally performed inside a reflow oven), (4) cleaning the completed assembly (an operation that may involve washing and drying) and (5) testing the assembly for proper functionality (detects components damaged during step (3) and the presence of defective soldered joints.) Rework or rejection may be required after operation (5).

Deposition of solder paste on the PCB's soldering pads (step (1) above) is nowadays accepted as the critical process step for controlling the quality of finished solder joints. Some statistical data shows that up to 64% of soldered joints defects can be traced back to the step of solder paste printing. The problem is almost intolerable when trying to solder high-pin-count surface-mount components which lead-pitch is smaller than 0.5 millimeter.

Repair to fix defective joints adds cost, may by itself create scrap, and invariably degrades the quality and reliability of the PCB assembly.

Consequently, if the traditional paste printing step is eliminated from the assembly floor, while still adequately delivering or interposing sufficient solder onto the joints to be soldered, many advantages will be derived.

Solid Solder Deposit (SSD) refers to a relatively thick layer of solid solder metallurgically bonded over the soldering pads of a bare-PCB. Bare-PCB refers to a conventional PCB that requires deposition of solder paste prior to a reflow soldering operation.

SSD printed circuit board (SSD-PCB) refers to a PCB with soldering pads covered by SSDs. Therefore, a SSD-PCB provides by itself the source of solder needed to solder components on it. The manufacture SSD-PCBs became more available to the United States electronics manufacturing or electronics packaging industry during 1998.

Because with SSD-PCBs no solder paste is used on the assembly floor, defect-free PCB assemblies are easily attained. SSD-PCBs can be optically and electrically inspected before accepted for components placement.

The most recent technology for producing SSD-PCBs is cover by the following four patents; (1) U.S. Pat. No. 5,315,070 Printed wiring board to which solder has been applied issued May 24, 1994, (2) U.S. Pat. No. 5,271,548 Method for applying solder to and mounting components on printed circuit boards issued Dec. 21, 1993, (3) U.S. Pat. No. 5,172,853 Method for applying solder to printed circuit boards and printed wiring board to which solder has been applied issued Dec. 22, 1993 and (4) U.S. Pat. No. 5,051,339 Method and apparatus for applying solder to printed wired boards by immersion issued Sep. 24, 1991.

When this inventor recognized that the prior art for manufacturing SSD-PCBs, including those disclose by the four above cited patents, need to be improved or replaced, the objectives and purposes of this invention were inspired, leading him to the conception and accomplishment of this invention.

OBJECTIVES AND ADVANTAGES OF THE INVENTION

The general objective of my invention is to provide the electronics manufacturing or electronics packaging industry with a new, safe, reliable, speedier, cheaper and useful apparatus and process for producing SSD-PCBs. Utilization of my invention will: (1) reduce the cost of SSD-PCBs, (2) improve SSD-PCBs quality and (3) require fewer manufacturing equipment. Also my invention allows to improve the quality and reliability of electronic products assembled around SSD-PCBs.

Further objectives and advantages of my invention will become apparent from a consideration of the drawings and following descriptions.

BRIEF DESCRIPTION OF THE DRAWING FIGURES

FIG. 1 shows, in perspective view, one embodiment of my U.S. Pat. No. 6,188,052 B1.

Figure 6:
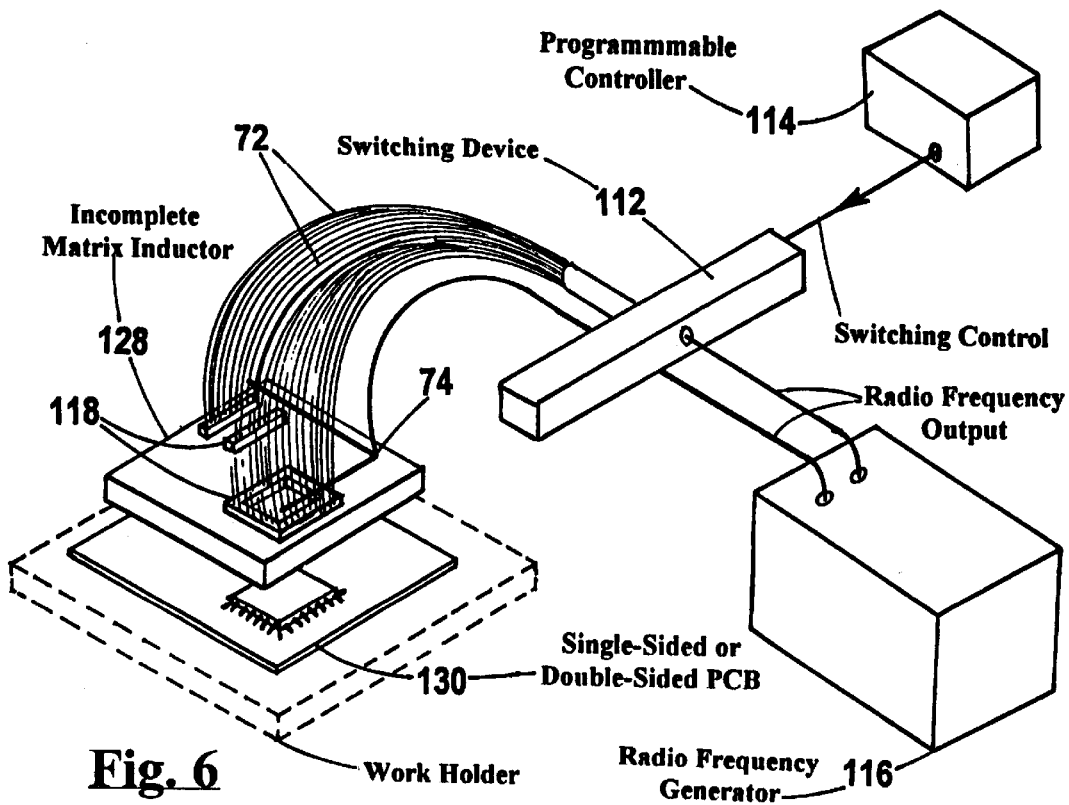

FIG. 6 shows, in perspective view, a second embodiment of my U.S. Pat. No. 6,188,052 B1.

REFERENCE NUMERALS IN DRAWINGS

For the benefit of those readers that may wish to compare this invention with my U.S. Pat. No. 6,188,052 B1 the same numerals are used by both applications when identifying similar parts. Numerals 200 and higher do not have equivalent in said copending application and when underlined represent an assembly or a group of components.

72 extension wire, part of 110
74 common extension wire, part of 110
76 cable harness, part of 110
110 flat matrix inductor
112 switching device
114 programmable controller 116 radio-frequency generator
118 individual inductor cell
120 single pole switch
122 single-sided PCB
128 incomplete matrix inductor
200 flush bare-PCB
202 dielectric substrate
204 soldering pad
206 interconnecting trace
208 solder mask
210 shower of fine solder particles (or of solder powder)
212 solder particle
214 partially molten solder particle
216 molten solder layer
218 particle striking molten solder layer
220 bouncing particle
222 bouncing particle
224 hanging particle
226 solder pocket (window into solder mask 208)
228 pocketed bare-PCB
230 bare-PCB
232 solder powder pile
234 workholder
236 clamping means
238 perimeter fence
240 shaker means
242 heater means
244 enclosure chamber
246 controllable inlet/outlet means
248 process gas
250 gap (between 110 and 232)

SUMMARY OF THE INVENTION

This invention discloses a novel apparatus and process for manufacturing SSD-PCBs namely PCBs that are ready to be soldered. It is well known that by covering the PCB's soldering pads with a relatively thick layer of solid solder that is metalurgically bonded to said pads it is possible to bypass the conventional paste printing process from the assembly floor. The SSD-PCB provides by itself sufficient source of solder to adequately solder components on it. Paste printing is a costly process that yields high rates of rejects. Specifically my invention reduces the cost of manufacturing SSD-PCBs, improves SSD-PCBs quality while requiring fewer manufacturing equipment. As a result, electronic products assembled around SSD-PCBs become of better quality and more reliable and its manufacturing cost is reduced.

In the manufacture of SSD-PCBs according to the prior art solder paste is precisely deposited on the soldering pads of a PCB by a printing process. Subsequently the paste-printed PCB is melted inside a reflow oven. As result, a relatively thick layer of SSD is formed over the soldering pads. After the board is cleaned and the solid solder deposits are pressed flat by a flattening step, the board is ready to accept placement of all the electronic components required for the final reflow operation.

Consequently, until now, two relatively costly equipments are needed to fabricate SSD-PCBs, namely a paste printer and a reflow oven. Contrariwise, my invention only requires one apparatus, or single platform, in order to transform a PCB into a SSD-PCB. This feat is made possible by using a novel method and device to deliver solder to a PCB. Said device works in cooperation with the apparatus disclosed by my U.S. Pat. No. 6,188,052 B1.

My device only heats the pads to be deposited with solid solder. The PCB's dielectric substrate and its connecting traces remain relatively cold. As a result, my novel apparatus consumes much less energy than the four patents cited above.

DESCRIPTION OF ELECTROMAGNETIC INDUCTION HEATING

Since the apparatus disclosed by my U.S. Pat. No. 6,188,052 B1 utilizes Electromagnetic Induction Heating (E.I.H.), also known as Induction Heating, it seems desirable to briefly present an overview of the physics principle governing E.I.H. as well as to introduce the actual apparatus disclosed by said Patent Application. This information will assist the reader to fully comprehend how and why this invention works.

For an in-depth treatment of theory, practice and application of E.I.H. the reader is referred to either: engineering handbooks, textbooks, electric heating trade magazines and journals, industrial heating conference proceedings and data sheets from manufacturers of E.I.H. equipment.

It is fundamental to recognize that E.I.H. allows to heat metallic bodies (or electric conductors), but not electric insulators, to very high temperatures by a solenoid, winding or coil, that essentially remains cold. Conventional heating uses a heat source having a higher temperature than that of the body to be heated. Heat from that hot source is indiscriminately transferred to all bodies surrounding the source (indistinctly if the body is an electric conductor or an electric insulator.) Heat from a hot source can be transferred by conduction, convection, radiation or a combination of the three mechanisms.

E.I.H. exhibits three important properties that are advantageously exploited by my invention, namely: (1) direct creation of localized heat inside the metallic part to be heated without utilizing a hot source, (2) very low thermal inertia and (3) very high heat (or power density) concentration on the surface of the metallic part being heated. The E.I.H. process can induce or deliver heat rate per unit surface area, up to 100 times higher than those transferred by a reflow soldering process.

Figure 1:
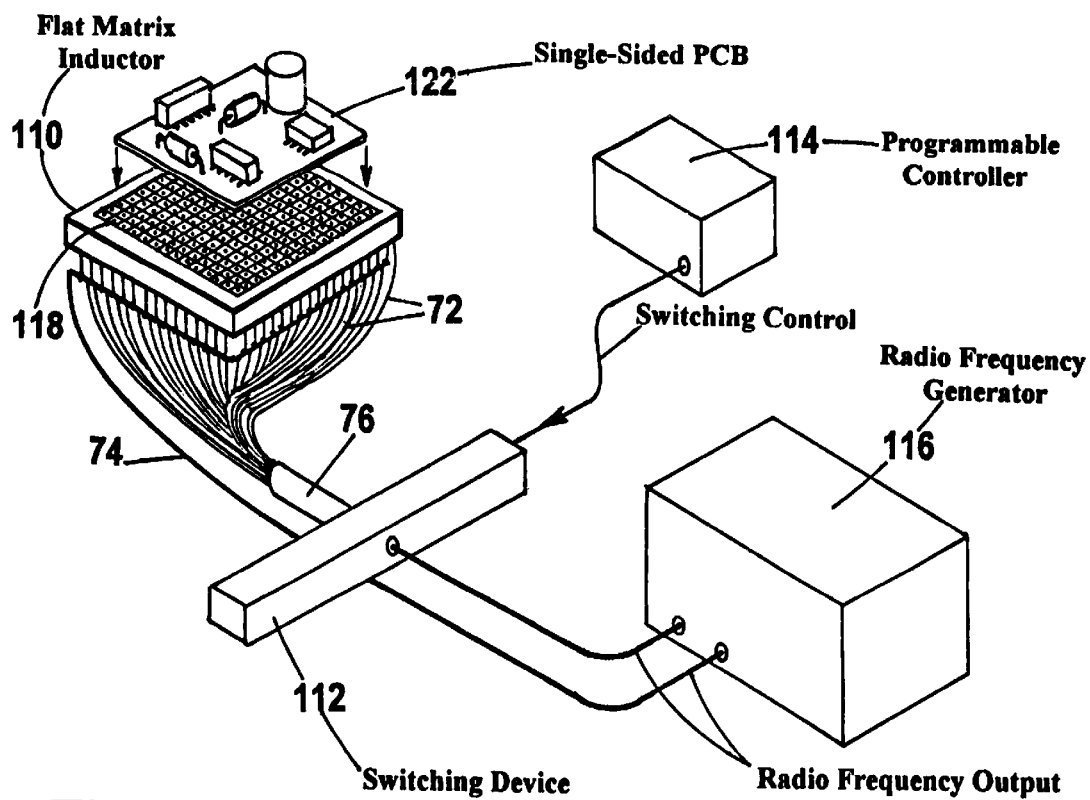

FIG. 1 is a reproduction of FIG. 32 from my U.S. Pat. No. 6,188,051 B1 that illustrates one particular embodiment that comprise a flat matrix inductor 110 (itself comprising a set of individual inductor cells 118 arranged in rows-and-columns in a matrix fashion), a switching device 112, a programmable controller 114 and a radio-frequency generator 116. Each inductor cell 118 contains one solenoid that is capable of being electrically connected in parallel to generator 116 by means of device 112. Device 112 comprises a multiplicity of single-pole switches 120 (not shown in FIG. 1) that are capable of connecting each inductor cell 118 to generator 116 (independently of other inductor cells 118) for a different duration of time under control, or instruction, exerted by said controller 114 upon said device 112. Generator 116 is capable of supplying an alternating current controllable in intensity and frequency.

In operation, as envision by U.S. Pat. No. 6,188,052 B1 a single-sided PCB 122 already including a multiplicity of diverse electronic components ready to be soldered is placed and held on the top face of said inductor 110, subsequently said generator 116 is activated and concurrently every particular switch 120, that connects an individual inductor cell 118 positioned under a joint to be soldered, is closed for a predetermined time duration sufficiently long to achieve melting of solder alloy to successfully solder the corresponding joints. Said particular switches 120 can all be closed simultaneously or in a sequential grouped manner.

Notice that the apparatus of FIG. 1 can be utilized to generate heat into any electric conductor placed adjacent to matrix inductor 110. If an alternating current is simultaneously supplied to every individual inductor cell 118, a multiplicity of variable magnetic fields (not shown in FIG. 1) will emanate upward from the top face of inductor 110 forming a—carpet-like magnetic field—of finite thickness. On the other hand, if the alternating current is only supplied to a few inductor cells 118 the upward emanating magnetic fields will not cover the top face in its totality.

In operation, a metallic part or multiplicity of metallic parts placed and held on the top face of inductor 110 will be heated by the variable magnetic fields emanating upward from its top face.

DESCRIPTION OF INVENTION

Figure 2:
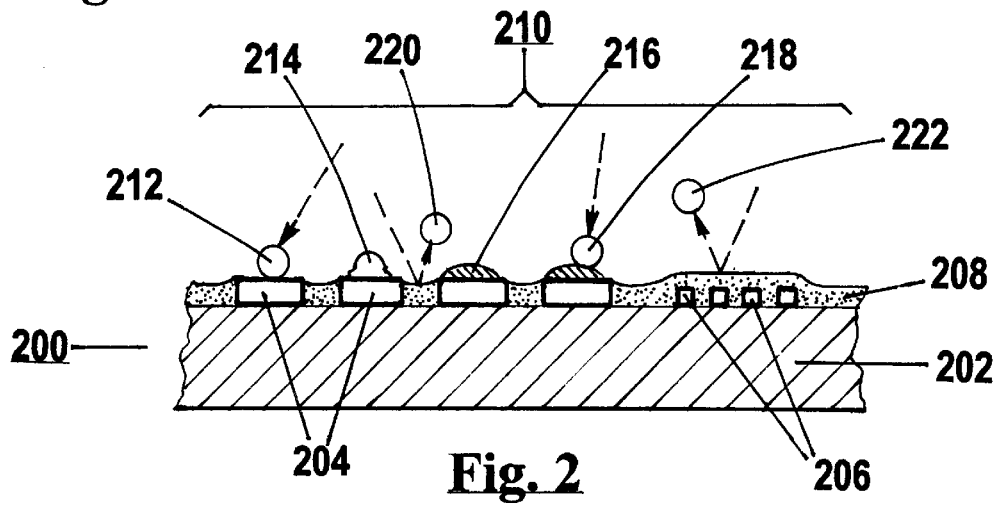
FIG. 2 shows, in cross-sectional side view, a portion of a flush bare-PCB exposed to a shower of fine solder particles.
Figure 3:
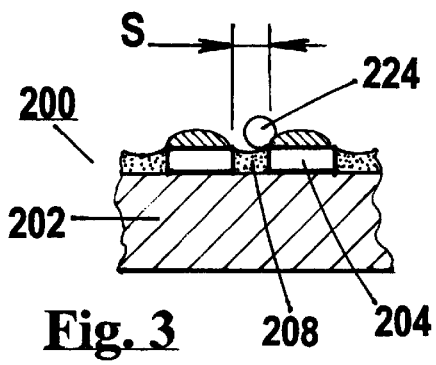
FIG. 3 shows, in cross-sectional side view, a portion of a flush bare-PCB with a solder particle hanging over the edge of a soldering pad.
Figure 4:
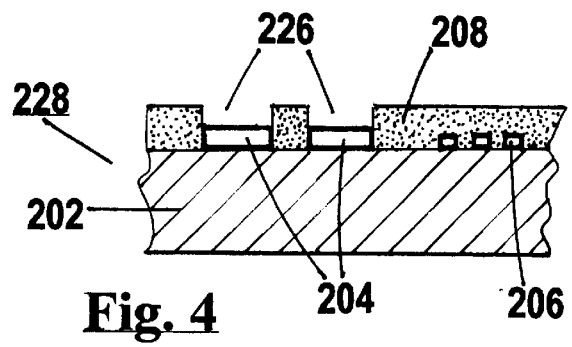
FIG. 4 shows, in cross-sectional side view, a portion of a pocketed bare-PCB.
Figure 5:
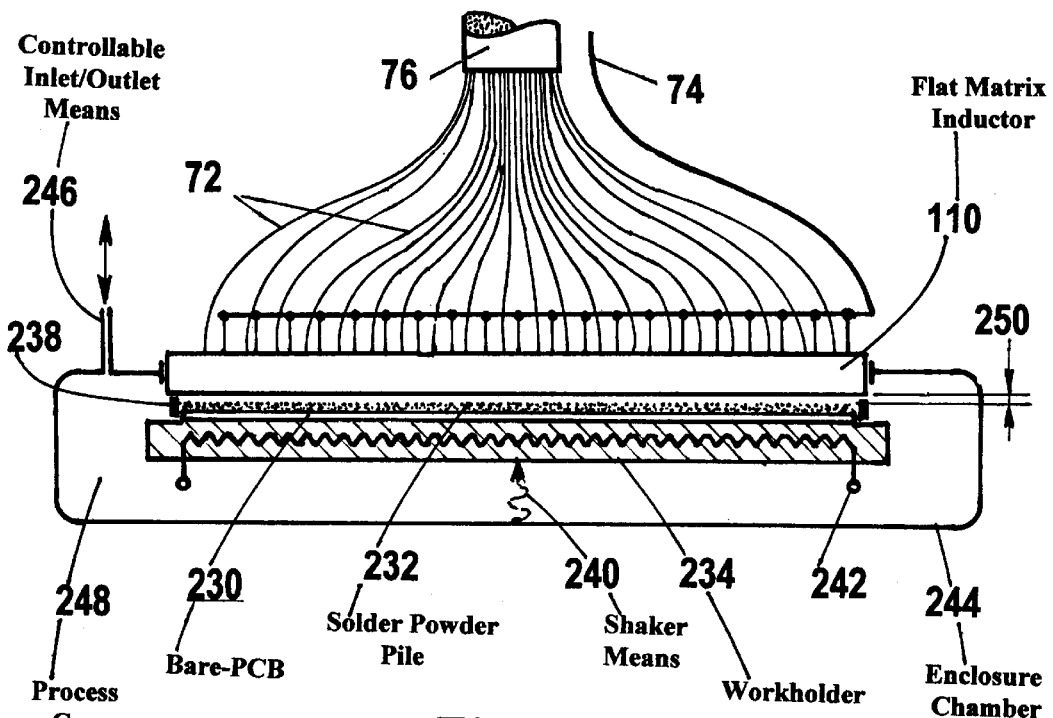
FIG. 5 shows, in cross-sectional side view, the embodiment of this invention.

Now, aided by FIG. 2 through FIG. 4, I shall illustrate and describe the novel and non-obvious approach that represents the foundation of this invention. The preferred embodiment is illustrated in FIG. 5 and will be described in the next part of this specification.

FIG. 2 shows, in cross-sectional side view, a portion of a flush bare-PCB 200 consisting of a dielectric substrate 202, a plurality of soldering pads 204, a plurality of interconnecting traces 206 and solder mask 208 filling in-between and around all the pads 204 and also covering all traces 206. Consequently, solder mask 208 covers the entire face of the PCB except for the soldering pads that remain exposed. The thickness of solder mask 208 is approximately equal to the thickness of pads 204.

Assume a shower of fine solder particles (or a shaken cloud of solder powder) 210 striking PCB 200 from above. To simplify the figure and avoid clutter, few particles are shown in FIG. 2. In addition, assume that all soldering pads 204 are individually heated (and maintained heated) at a temperature substantially above the temperature level at which said solder particles melt. Also, assume that the rest of flush bare-PCB 200, namely its substrate 202, its interconnecting traces 206 and its solder mask 208 are all kept at a temperature substantially lower than that at which said solder particles melt.

In FIG. 2 a single particle 212 is shown just after striking a soldering pad 204. The particle will not bounce back if the rate of heat transferred from pad 204 into particle 212 is sufficiently high. If so, the particle will melt locally at its point of contact with pad 204 and stick to the pad. Subsequently the particle will further absorb heat thus melting throughout part of its mass while deforming and wetting the surface of pad 204 as shown for the case of particle 214. As time progresses the particle will melt throughout its entire mass acquiring a relatively flat shaped protuberance or layer 216. A particle 218 that strikes a pad already wetted by a previous impact will also melt adding thickness on top of the existing layer of molten solder.

A particle 220 that strikes solder mask 208 will bounce back because de solder mask, been relatively cold, cannot induce melting of particle 220. Likewise, particle 222 shown striking a region of solder mask 208 covering traces 206 will also bounce back.

As the shower of fine solder particles 210 continues, the thickness of molten-solder covering all the pads 204 will continue to grow. After shower 210 is discontinued and pads 204 are allowed to cool down, all the individual layers of molten solder covering every pad 204 will solidify forming SSDs that are convex or hump-shaped due to the surface tension prevailing within the molten solder mass.

Because only soldering pads 204 are heated while the surrounding solder mask 208 remains cold, some heat is transferred from pads 204 edges into contiguous solder mask 208. Therefore, a temperature gradient develops from around the perimeter of pad 204 toward its center. The center of pad 204 is the hottest area. Consequently, solder particles striking near the edge of a soldering pad 204 while melting will run (or move) toward the center of the pad 204 under capillary action due to said temperature gradient.

However, occasionally solder particles striking the edge of a pad 204 could partially melt and adhere to a pad 204 overhanging over solder mask 208 (but not sticking to solder mask 208) as it is shown in FIG. 3 for the case of hanging particle 224. This situation could trigger solder bridging if the particle size is comparable to the space "S" available between adjacent pads.

Particle size for commercially available solder powders range from 150 microns down to 5 microns and are classified as Type 1 through Type 6 as given by Industry Standards such as IPC/ANSI J-STD-005. Particle size for processing a specific flush bare-PCB should be small enough to prevent solder bridging between adjacent pads.

Although the optimum particle size for each specific SSD application must be determined experimentally by trials, as a guideline, assume that solder bridging would not occur if the particles diameter are from five to ten times smaller than the space separating adjacent pads. For example, a PCB suitable for extra-fine pitch surface-mount devices may require a space "S" between adjacent pads of about 0.2 mm. For such application solder powder within the 40 microns to 20 microns range will be adequate. In other words, solder powder Type 4 (38–20 microns) should be adequate.

Notice that the prior art for manufacturing SSD-PCBs (as disclosed by the four patents cited above) requires the creation of a solder pocket (void or window) 226 around the perimeter of each pad 204 (leaving its face exposed) as shown in FIG. 4. The pockets are formed into solder mask 208 which thickness, in this case, is larger than the thickness shown in FIGS. 2 and 3. This particular board will be referred as pocketed bare-PCB. Solder pockets 226 are filled with a predetermined amount of solder paste and then reflowed. Because the prior art utilizes solder paste, that demands that the board be slowly heated throughout its entirety, solder pockets 226 are indispensable to prevent bridging among adjacent pads 204.

The pocketed bare-PCB 200 shown in FIG. 4 can readily be utilized with my SSD process described above. A pocketed bare-PCB 228 allows to utilize much larger solder particle size than with a flush bare-PCB 200. Solder pockets 226 prevent relatively large solder particles from migrating (or overhanging) into adjacent pads when melting. Thus, utilization of a pocketed bare-PCB 228 allows to use larger solder particles than with a flush bare-PCB 200 without risk of solder bridging.

Hereinafter, the terminology—bare-PCB—will indistinctively denote or refer either to a flash bare-PCB 200 or to a pocketed bare-PCB 228 since my SSD process is readily applicable to both type of PCBs.

Although, not illustrated in FIG. 2, it should be understood that the process described above is equally applicable (a) to form SSDs on solder rings used for through-hole mount devices and (b) for filling via holes with solid solder.

The process described above constitute the basis for this invention. Unlike the prior art methods for producing SSD-PCBs, with this invention solder paste is not utilized and thus paste printing equipment is not required.

Therefore, to accomplish my SSD process, as described above and illustrated by FIG. 2, a bare-PCB must simultaneously be subjected to the following two conditions: (1) individual heating of all its soldering pads preferably without heating its substrate, its solder mask and its traces and (2) exposing the board to a shower or random impingement of solder particles (or a shaken cloud of solder powder.) Although, random particle impingement is preferred, my SSD process can also be attained by covering the bare-PCB with a pile of solid solder particles evenly accumulated over its face.

If in FIG. 1 the single-sided PCB 122 is replaced by a bare-PCB then, when a predetermined set of inductors 118 (forming part of flat matrix inductor 110) is supplied with alternating current only the soldering pads 204 will be heated thus satisfying above requirement (1). This approach of heating a bare-PCB from its underside (with the variable magnetic field traversing throughout the PCB thickness) is only suitable for single-sided PCBs containing a single layer of substrate with no ground plane. It is very desirable that a double-sided PCBs be heated by an inductor 110 placed on its top facing the side to be covered with SSDs. To produce a double-sided PCB both faces need to be independently processed as described above.

Summarizing, my SSD process offers important advantages in comparison to the prior art. Manufacturing savings are realized because it eliminates the paste printing step and allows savings in capital cost associated with the displaced paste printing equipment. Also, my process is faster than the prior art process because the heating phase of my process is completed in a few seconds while the prior art consumes a few minutes. In addition, my process does not require a cooling phase, as does the prior art after its oven reflow phase, thus further reducing process time.

DESCRIPTION OF INVENTION IN PREFERRED EMBODIMENT

Referring now specifically to the entirety of my invention, a typical embodiment of my invention is shown in FIG. 5 illustrated in accordance with the objectives of my invention by comprising a flat matrix inductor 110 (itself comprising a set of individual inductor cells 118 arranged in rows-and-columns in a matrix fashion, not shown in FIG. 5), a switching device 112 (not shown in FIG. 5), a programmable controller 114 (not shown in FIG. 5), a radio-frequency generator 116 (not shown in FIG. 5), a bare-PCB 230, a solder powder pile 232 covering the face of bare-PCB 230, a workholder 234, clamping means 236 (not shown in FIG. 5), perimeter fence 238, shaker means 240 to shake workholder 234, heater means 242 to heat workholder 234, an enclosure chamber 244, controllable inlet/outlet means 246 and a process gas 248.

The SSD process starts with bare-PCB 230 firmly attached or clamped down to workholder 234 by clamping means 236. The face of bare-PCB 230 containing the soldering pad to be covered with SSD must be facing upward. A relatively even layer of solder powder 232 is distributed over the entire upper face of bare-PCB 230 by any known method. Matrix inductor 110 is placed, facing down, on top of solder powder pile 232 with a predetermined gap 250.

Enclosure chamber 244 acts first as a containment for solder powder 232 in order to prevent the powder from becoming airborne and thus causing occupational health and safety risk. Secondly, via controllable inlet/outlet means 246 enclosure chamber 244 can be filled with an inert process gas 248 such as Nitrogen or Argon to prevent oxidation of solder powder 232, mainly when at molten state, and thus enhancing molten solder wetability of soldering pads. Enclosure chamber 244 can also be filled with a gas or vapor 248 capable of acting as fluxing agent. Alternatively, vacuum can be created inside enclosure chamber 244 for fluxless processing.

In operation, workholder 234 is shaken by shaker means 240 causing the particles inside solder powder pile 232 to randomly jump and drop back over the face of bare-PCB 230. Perimeter fence 238 encircles bare-PCB 230 to prevent that said particles may jump or drop-off from its face.

There are other acceptable means for generating random impingement of solder particles than by shaking workholder 234. For example by exposing solder powder pile 232 to ultrasounds, a turbulent flow of process gas 248, by a sifter action, etc.

Simultaneously with the random impingement of solder particles, generator 116 as invisioned by U.S. Pat. No. 6,18,052 B1 is activated while every particular switch 120, that connects an individual inductor cell 118 positioned above a pad 204 to be covered with SSD, is closed for a predetermined time duration sufficiently long to achieve melting of enough solder powder to successfully cover the corresponding pads with a layer of SSD of predetermined thickness. Said particular switches 120 can all be closed simultaneously or in a sequential grouped manner.

As an option, solder powder 232 can be pre-heated by any known means that may include: hot process gas, direct infrared radiation, etc. or by transferring heat from workholder 234 which, in turn, is being heated by heater means 242. Pre-heating the solder powder accelerates particle melting and improve its ability to wet soldering pads 204.

In operation, it is possible to selectively cover specific pads 204 with a thicker layer of SSD than others pads, By closing predetermined switches 120 for longer time that others, the pads 204 positioned under the corresponding individual inductor cells 118 will be covered with a thicker layer of SSD. This flexibility cannot be attained by using a paste printing process as it is done by the prior art.

When the above process is deemed complete, excess or surplus solder powder that did not melt (for example because it fell over areas covered by solder mask 208, etc.) will remain loose over the face of PCB 230. This powder can be swept off from the face of PCB 230 by any known method. The powder can be recovered to be recycled when processing the next bare-PCB.

During the above SSD process, some solder particles (that had not reached liquidus state throughout its entire mass) may adhere to the edges of soldering pads protruding toward an adjacent pad. This situation could later (during subsequent processing of the SSD-PCB) result in solder bridging between adjacent pads. To prevent this undesirable situation, after the board has been swept clean of loose solder powder, the protruding particles can be dislodged by scrubbing or brushing and/or washing the face of the bare-PCB 230.

When it becomes necessary to form a relatively thick layer of SSD it may be desirable to subject bare-PCB 230 to intermediate cleaning operations to remove solder material protruding from the pads before it could cause solder bridging. Subsequently, a new layer of SSD can be safely added to the clean PCB by repeating the above operation. Generally the SSD process is complete when a predetermined thickness (usually ranging from 75 microns to 150 microns) of solder is deposited over pads 204.

The resulting SSDs are convex or hump-shaped and need to be leveled to obtain the coplanarity required to efficiently solder surface-mounted components. The SSDs are flattened by any known pressing or rolling operation. Should the solder alloy of the SSDs be a non-euthetic type, post-heating the SSDs below its liquidus state soften them and facilitates the flattening operation. Inductor 110 can be advantageously utilized for post-heating said convex SSDs prior to a flattening operation. After flattened, the SSD-PCB is completed and ready to accept placement of electronic components.

Flat matrix inductor 110 is an adaptable and versatile tool that can accurately heat many different PCB layouts by selecting the appropriate set of switches 120, that connect individual inductor cells 118 positioned above soldering pads 204 to be covered with SSD. However, for high volume production of SSD-PCBs it could be preferable a hard-tooled, or inflexible, inductor. Although a hard-tooled inductor is only useful for a particular PCB layout it is much simpler and much cheaper to manufacture than a flat matrix inductor 110 because it comprise a much smaller number of individual inductor cells 118 than a comparable flat matrix inductor 110.

FIG. 6 is a reproduction of FIG. 35 from my U.S. Pat. No. 6,188,052 B1 that illustrates a second embodiment comprising an incomplete matrix inductor 128 that in fact is a hard-tooled inductor. Essentially, if in FIG. 1 flat matrix inductor 110 is replaced by incomplete matrix inductor 128 we obtain the apparatus shown in FIG. 6.

It should be understood that either the apparatus of FIG. 1 or FIG. 6 can indistinctly be utilized as part of the preferred embodiment depicted in FIG. 5. Consequently, hereinafter in the claims the terminology —E.I.H. device— equally identifies or refers to the apparatus of FIG. 1 or FIG. 6. Also, hereinafter in the claims the terminology—matrix inductor—equally identifies or refers to either a flat matrix inductor 110 or a incomplete matrix inductor 128.

SUMMARY, RAMIFICATIONS, AND SCOPE OF INVENTION

Accordingly, the reader will see that this invention is a truly innovative one that provides the electronic packaging industry with a new, safe and reliable method and apparatus for manufacturing SSD-PCBs suitable for mounting surface-mount, straddle-mount and through-hole types devices. Since during the SSD process my device heats only the pads to be covered with solid solder, the utilization of my invention offers the following advantages when compared to the prior art:

permits to manufacture SSD-PCBs while the PCB's dielectric-material, the interconnecting traces and the solder mask remain unheated thus and so sparing the PCB from the harsh reflow process that prior art requires.

permits to create SSDs on soldering pads for surface-mount and straddle-mount components and on solder rings for through-hole components.

permits filling via holes with solid solder.

the heating phase of my process is about fifty times faster than prior art.

my process does not require a cooling phase after heating further reducing process time.

reduces the cost of manufacturing SSD-PCBs.

improves the reliability of SSD-PCBs.

reduces formation of intermetallic layer between SSD and pads thus improving subsequent solder joints robustness.

causes a fast solder-solidification rate resulting in yet more robust bond of the SSDs.

reduces energy consumption by about 200 times with respect to the prior art.

reduced the cost of capital investment because, unlike the prior art, paste printing equipment and reflow oven are not needed to fabricate SSD-PCBs.

reduces the required manufacturing floor space.

Although the above description contains many specificities, these should not be construed as limiting the scope of the invention but as merely providing illustrations of some of the presently preferred embodiments of this invention. Many other variations and structural changes are possible without departing from the spirit and scope of this invention. For example my invention is not limited to PCBs and substrates that are rigid, it is equally applicable to produce SSD on Flexible Circuits.

Accordingly, the scope of my invention should be determined by the appended claims and their legal equivalents, rather than by the embodiment illustrated.

I claim:

1. An apparatus primarily intended for manufacturing SSD-PCBs by inductively heating solder powder, comprising:
   (a) a bare-PCB comprising a plurality of soldering pads on a side facing upward, said bare-PCB spread with a solder powder pile over said side facing upward, and
   (b) a workholder where said bare-PCB is firmly attached, and
   (c) shaker means for shaking said workholder during operation wherefrom said solder powder pile is shaken in order to induce random impingement of solder particles on said side facing upward, and
   (d) an E.I.H. device comprising a flat matrix inductor, a radio frequency generator, a switching device and a programmable controller, said flat matrix inductor comprising a plurality of individual inductor cells arranged in a matrix fashion, said flat matrix inductor placed facing down on top of said bare-PCB with a predetermined gap, said E.I.H. device only generates electromagnetic energy via each and every individual inductor cell that is aligned with a soldering pad thereby inducing localized heating into said plurality of soldering pads for a predetermined time sufficient to cause localized melting of said solder powder pile consequently forming a layer of SSD controllable in thickness over each and every soldering pad forming part of said plurality of soldering pads whereby in operation the dielectric substrate forming said bare-PCB, its interconnecting traces and solder mask all remain relatively cold.

2. The apparatus of claim 1, further including:
   (e) heater means for heating said workholder wherefrom pre-heating of said solder powder pile is attained prior to said localized heating onto said plurality of soldering pads, said pre-heating permits to accelerate said localized melting of said solder powder pile.

3. The apparatus of claim 2, further including:
   (f) an enclosure chamber that restrains solder powder particles from becoming airborne into the outside atmosphere.

4. The apparatus of claim 3, further including:
   (g) controllable inlet/outlet means for filling said enclosure chamber with a predetermined process gas or for creating vacuum inside said enclosure chamber thus enhancing wetability of said solder powder pile during said localized heating.

* * * * *